United States Patent [19]
Nakashima et al.

[11] Patent Number: 5,658,809
[45] Date of Patent: Aug. 19, 1997

[54] SOI SUBSTRATE AND METHOD OF PRODUCING THE SAME

[75] Inventors: Sadao Nakashima; Katsutoshi Izumi, both of Tokyo; Norihiko Ohwada, Musashino; Tatsuhiko Katayama, Hiratsuka, all of Japan

[73] Assignees: Komatsu Electronic Metals Co., Ltd., Kanagawa; Nippon Telegraph and Telephone Corporation; NTT Electronics Technology Corporation, both of Tokyo, all of Japan

[21] Appl. No.: 403,518

[22] Filed: Mar. 13, 1995

[30] Foreign Application Priority Data

Mar. 23, 1994 [JP] Japan .................................. 6-076538

[51] Int. Cl.$^6$ ...................................... H01L 21/265
[52] U.S. Cl. .............................. 438/766; 438/480
[58] Field of Search .......................... 437/26, 62, 25, 437/61, 974

[56] References Cited

U.S. PATENT DOCUMENTS

| | | | |
|---|---|---|---|
| 4,749,660 | 6/1988 | Short et al. ........................... | 437/24 |
| 4,824,698 | 4/1989 | Jastrzebski et al. . | |
| 4,948,742 | 8/1990 | Nishimura et al. ................... | 437/26 |
| 4,975,126 | 12/1990 | Margail et al. ........................ | 437/25 |
| 5,196,355 | 3/1993 | Wittkower . | |
| 5,310,689 | 5/1994 | Tomozane et al. . | |
| 5,429,955 | 7/1995 | Joyner et al. ......................... | 437/28 |

FOREIGN PATENT DOCUMENTS

| | | |
|---|---|---|
| 0595233 | 10/1992 | European Pat. Off. . |
| 0570057 | 11/1993 | European Pat. Off. . |
| 0239867 | 9/1989 | Japan . |
| 0240230 | 10/1991 | Japan . |
| 4264724 | 9/1992 | Japan . |

OTHER PUBLICATIONS

J. Stoemenos, et al., "New Conditions for Synthesizing SOI Structures by High Dose Oxygen Implantation", Journal of Crystal Growth, 73 (1985) 546–550.

C. Jaussaud, et al, "Defects in SIMOX Structures: Causes and Solutions", Vacuum, vol. 42, No. 5/6, pp. 341–347, 1991.

P.L.F. Hemment, et al, "Ion Beam Synthesis of Thin Buried Layers of $SiO_2$ in Silicon", Vacuum, vol. 36, Nos. 11/12, pp. 877–881, 1986.

P.L.F. Hemment, et al, "Nucleation and Growth of $SiO_2$ Precipitates in SOI/SIMOX Related Materials–Dependence Upon Damage and Atomic Oxygen Profiles", Nuclear Instruments and Methods in Physics Research, B39 (1989) 210–214.

J. Stoemenos, et al, "$SiO_2$ Buried Layer Formation by Subcritical Dose Oxygen Ion Implantation", Appl. Phys. Lett. 48 (21), May 26, 1986, pp. 1470–1472.

J. Stoemenos, et al, "Nucleation and Growth of Oxide Precipitates in Silicon Implanted with Oxygen", Thin Solid Films, 135 (1986), 115–127.

Primary Examiner—Trung Dang
Attorney, Agent, or Firm—McAulay Fisher Nissen Goldberg & Kiel, LLP

[57] ABSTRACT

A method of producing an SOI substrate having a single-crystal silicon layer on a buried oxide layer in an electrically insulating state from the substrate by implanting oxygen ions into a single crystal silicon substrate and practicing an anneal processing in an inert gas atmosphere at high temperatures to form the buried oxide layer. After the anneal processing in which the thickness of the buried oxide layer becomes a theoretical value in conformity with the thickness of the buried oxide layer formed by the implanted oxygen, the oxidation processing of the substrate is carried out in a high temperature oxygen atmosphere.

9 Claims, 9 Drawing Sheets

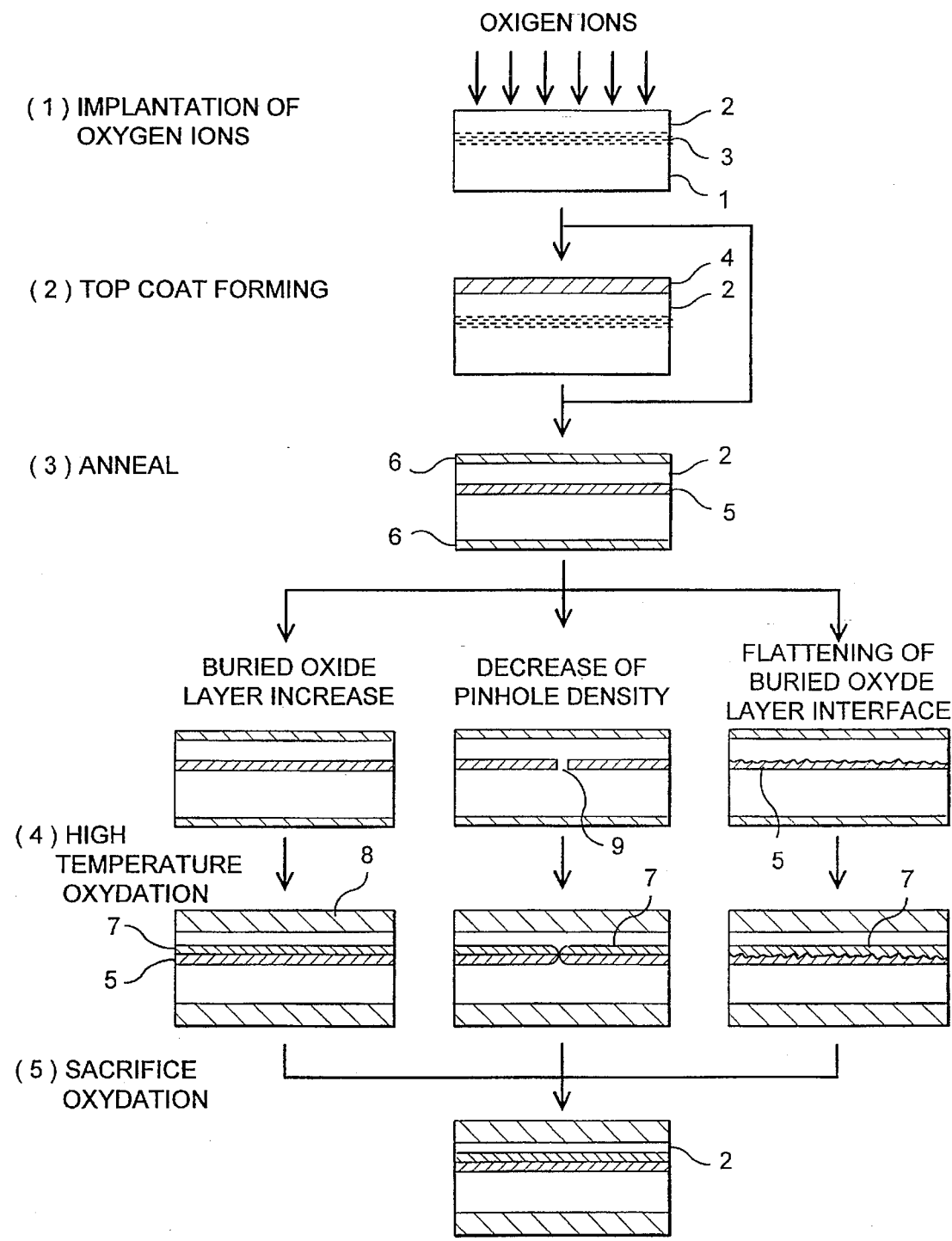
F I G. 1

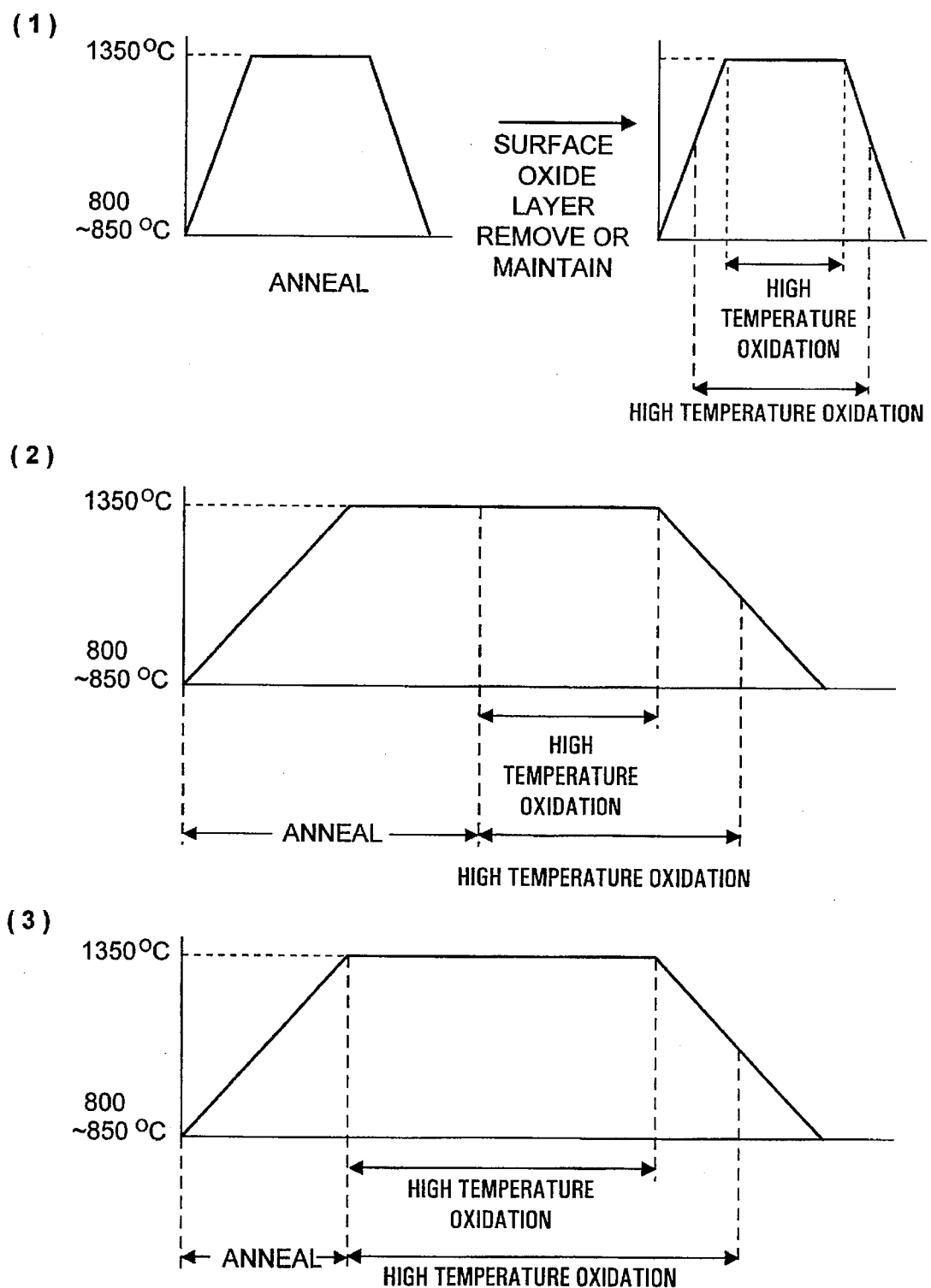
F I G. 2

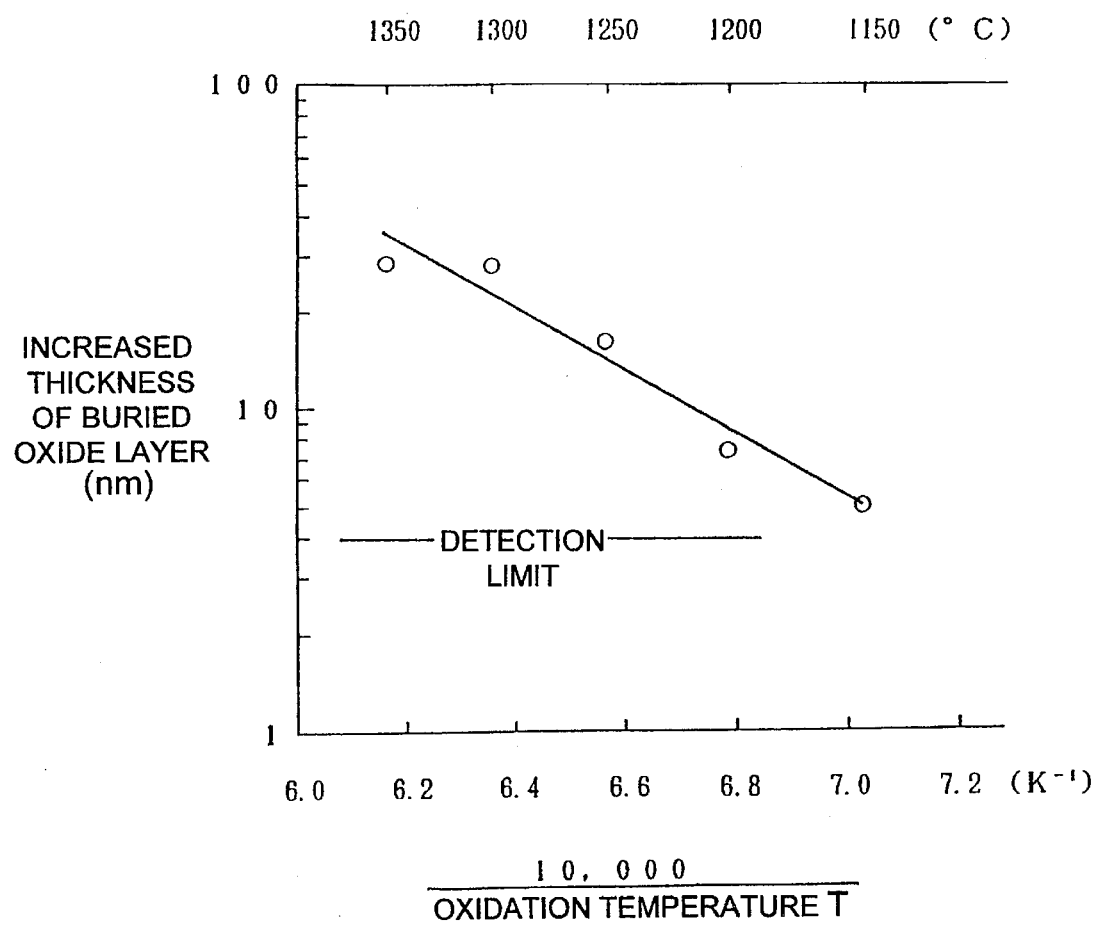
F I G. 4

SOI SUBSTRATE AND METHOD OF PRODUCING THE SAME

BACKGROUND OF INVENTION

1. Field of Invention

The present invention relates to a method for producing a single silicon substrate having an insulation layer.

2. Description of Related Art

It is well known in the art that a substrate including a thin single crystal silicon layer provided on an insulation layer is preferable as compared to a bulky single crystal silicon substrate when producing an integrated circuit. This is due to the fact that the insulation layer separates and shields elements used in the integrated circuit.

A single crystal silicon semiconductor substrate having an electrically insulated layer and a surface single crystal silicon layer in which the elements are formed is generally called an SOI (Silicon On Insulator) substrate. This type of semiconductor substrate is produced by either a wafer bonding method or an oxygen-ion implantation method.

When using a wafer bonding method, an oxide layer is first formed on the single crystal silicon substrate. Then, a wetted second single crystal silicon substrate is stock to to the first silicon substrate, such that a thin active silicon layer is formed by the wetted second single crystal silicon substrate. The oxygen-ion implantation method, which is known as SIMOX (Separation by IMplanted Oxygen), is preferable as compared to the wafer bonding method when forming a thin-film active silicon layer. SIMOX forms a buried oxide layer inside of the silicon substrate by allowing Si and O to react in a high temperature annealing process (1,100°–1,200° C.) after implanting a high dose of oxygen ions ($^{16}O^+$) into the single crystal silicon substrate.

The SIMOX method is the preferred method given that it produces a single crystal silicon substrate with an active layer having an uniform thickness without having to bond two wafers. However, even with the SIMOX method there are certain disadvantages.

Referring to FIG. 9, when a high quality substrate 1 is used in the SIMOX method a surface single crystal silicon 2 will generally have a low dislocation density. A surface single crystal silicon with a low dislocation density, as will be described below, adversely affects the electrically insulated state of a buried oxide layer 3 produced by oxygen ions. For example, a surface single crystal 2 with a low dislocation density will, upon implantation with oxygen ions, produce a buried oxide layer 3 with a small thickness which is approximately 80–90 nm. Thus, if a particle 10 attaches on the surface single crystal silicon 2 when oxygen ions are implanted, the buried oxide layer 3 will not be complete because of the masking effect produced by the the particle 10. In fact, after the annealing process, the incomplete buried oxide layer 3 produces a buried oxide layer.5 with a pinhole 9. As a result, an inferior electrical insulation layer is formed.

Reference 6 in FIG. 9 indicates a surface oxide layer which is formed after the annealing process.

FIG. 10 charts a correlation between the dose of the oxygen ions and the dislocation density in the surface single crystal silicon layer 2 (see J. Mater. Res., Vol. 8, No. 3, Mar. 1993 pp. 523–534). A a thickness of the buried oxide layer 3 can be increased by increasing the dose of the oxygen ions. Where the dose of oxygen ions is increased to a range of $1.0 \times 10^{18}/cm^2$–$2.0 \times 10^{18}/cm^2$, a crystal defect or dislocation density of single crystal silicon layer 2 is increased. Particularly, a dose of oxygen ions in over $1.5 \times 10^{18}/cm^2$ results in a sudden increase in the dislocation density of the single crystal silicon layer 2.

However, referring to FIG. 11, when the dose of the oxygen ions is in a range of $0.5 \times 10^{18}/cm^2$–$0.9 \times 10^{18}/cm^2$ (i.e., the range of the non-increasing crystal defect density), a breakdown strength of the electric field in the buried oxide layer 3 falls between a range of 0–1 MV/cm which is considered small Thus, the electric insulation property of the resulting oxide layer will be low.

Also, in the SIMOX substrate having a thin buried oxide layer 3, irregularity of an interface between the surface single crystal silicon 2 and the buried oxide layer interface produces an undesirable roughness. Specifically, the interface generally has a square root mean roughness (Rms) which is over 2 nm. This undesirable roughness can be sufficiently removed by spending a large amount of time on the annealing process, however, this is impractical n view of costs.

Accordingly, in view of the foregoing problems, it is an object of the present invention to provide an SOI substrate which can increase a thickness of its buried oxide layer without increasing the dose of implanted oxygen ions to prevent an increase of crystal defect in a surface single-crystal silicon layer. It is another object of the present invention is to provide a method of producing the SOI substrate capable of decreasing a pinhole density in the buried oxide layer. It is yet another object of the present invention is to provide a method of producing the SOI substrate which improves the roughness of the buried oxide layer interface. It is still another object of the present invention to provide an SOI substrate in which the crystal-defect density of the surface silicon layer is small, the buried oxide layer is increased more than a theoretical buried oxide layer thickness calculated from the dose of the implanted oxygen ions, the generation of pinholes is small, and the roughness of the buried oxide layer interface is improved.

SUMMARY OF INVENTION

The present invention conducts an annealing process after implanting the oxygen ions into the single crystal silicon substrate and additionally conducts an oxidation process after the annealing process in a high temperature atmosphere within a range between temperature of a 1150° C. and a temperature which is less than a melting temperature of the silicon to increase the thickness of the buried oxide layer to a thickness greater than that obtained by the anneal processing. According to the present invention, even if the pinholes are present in the buried oxide layer due to particles on the substrate surface when the oxygen ions are implanted, or if the roughness of the buried oxide layer interface to large, the pinholes can be repaired by the additional oxidation process and the roughness of the interface is also improved. The substrate obtained after the additional high temperature oxidation treatment is a SOI substrate in which the buried oxide layer is thickened, there are few pinholes in the buried oxide layer, and the roughness of the buried oxide layer interface is improved as compared with a conventional substrate produced by the SIMOX method.

BRIEF DESCRIPTION OF DRAWINGS

FIG. 1 is a diagram of a method and product in accordance with the present invention;

FIG. 2 is a diagram showing the relationship between temperature, an annealing process, and an oxidation process;

FIG. 4 is a graph of the relationship between the increase in thickness of a buried oxide layer layer and an oxidation temperature when an oxidation process is defined to last four hours and a concentration of $O_2$ is determined at 70% during the oxidation process;

FIG. 8(a) shows a conventional substrate produced by the SIMOX method, FIG. 8(b) shows a substrate produced by the SIMOX method which additionally receives an oxidation treatment with $O_2$ gas at a concentration level of 0.5%, and FIG. 8(c) shows a substrate produced by the SIMOX method which additionally receives an oxidation treatment with $O_2$ gas at a concentration level of 30%;

DETAILED DESCRIPTION OF PREFERRED EMBODIMENTS

Figure 3:
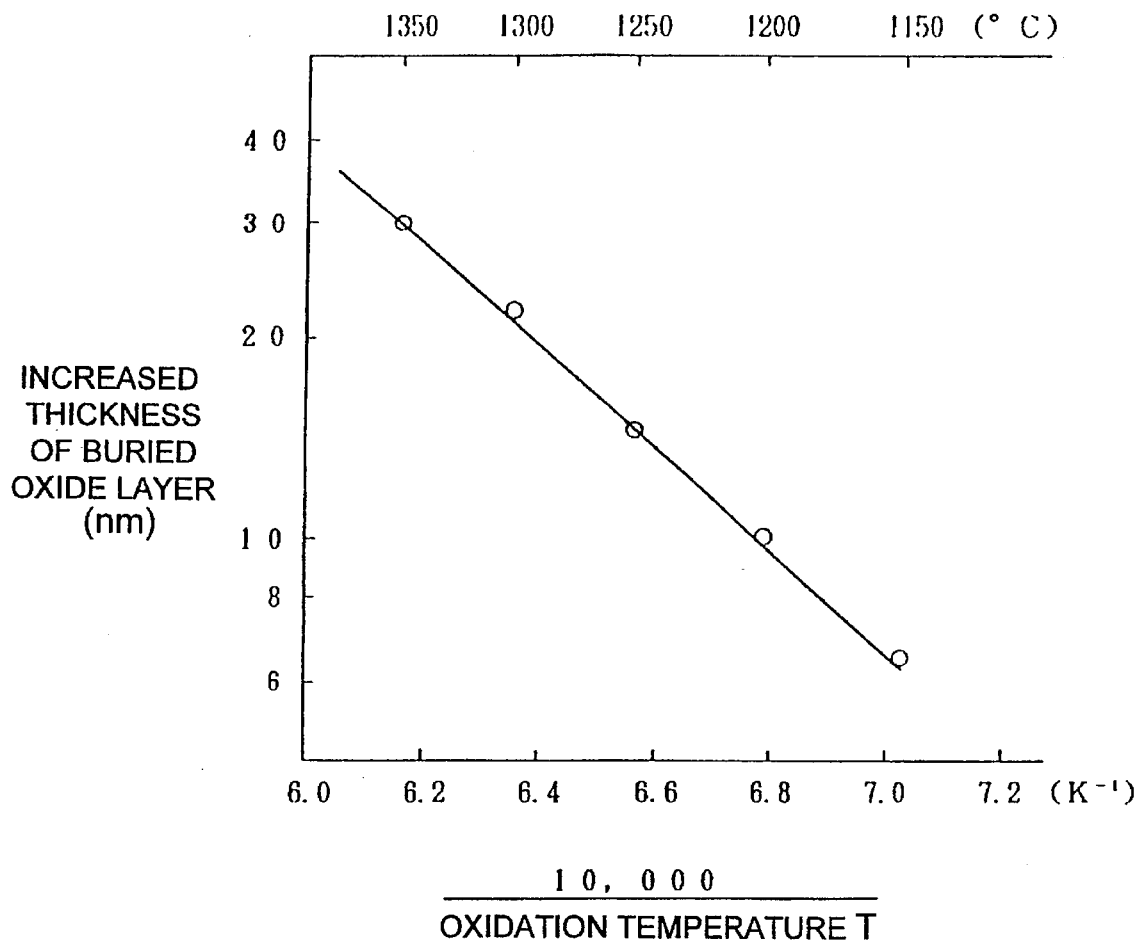
FIG. 3 is a graph showing the relationship between the increase in thickness of a buried oxide layer and an oxidation temperature when a surface single crystal silicon with a thickness of 180 nm is used in an oxidation process.

The present invention is based on the discovery that an oxide layer buried in a substrate produced by a SIMOX method grows when the substrate is subjected to a high temperature oxidation treatment. Specifically, in accordance with one embodiment of the invention, a substrate produced by a SIMOX method containing a surface active silicon layer with a thickness of 320 nm and a buried oxide layer with a thickness 89 nm is processed at a temperature set at 1350° C. under an oxygen atmosphere controlled at a partial pressure of 70% $O_2$ in an inert argon (Ar) gas. This oxidation treatment lasts for four hours. As a result of the treatment, the buried oxide layer grows to 118 nm The amount the buried oxide layer increases is determined by controlling the oxidation time to produce a thermally formed surface oxide layer with a thickness of about 400 nm and a surface silicon layer with a thickness of about 180 nm under different oxidation temperatures and conditions. As shown in FIG. 3, by increasing the oxidation temperature it is recognized that the thickness of the buried oxide layer is increased when the oxidation time falls between a range of 77–405 minutes. The effect of increasing the layer thickness is recognized at an oxidation temperature which exceeds 1150° C. From FIG. 3, it can be understood that the increase rate of the buried oxide layer thickness is greater at higher temperatures, although the thickness of the surface oxide layer remains the same and the buried oxide layer is thickly oxidized at the higher temperatures.

Similarly, FIG. 4 shows a state in which the oxidation time is set at four hours and the $O_2$ concentration is set at 70%. Accordingly, from FIG. 4, a temperature dependence of increasing the thickness of the layer when the oxidation time is specifically set can be understood. Also, it is natural that a temperature which is less than 1150° C. in an utilitarian scope is less than can be detecting.

In both FIGS. 3 and 4, an oxidation temperature of the lower horizontal axis indicates a numerical value of $10^4$ times a reciprocal number of an absolute temperature. The celsius temperature is indicated in the upper horizontal axis of the the drawings. As is evidenced by in the drawings, the thickness of the buried oxide layer is increased as the oxidation temperature is increased.

Even though the buried oxide layer thickness can be increased upon an increase of oxidation temperature, when the oxidation temperature is equal to or less than 1150° C., the increased thickness of the buried oxide layer is slight. Also, when the oxidation time is set at four hours at this lower temperature, the increased thickness is less than a level which can be detecting thus showing no increase in the thickness of the buried layer. But, if the oxidation temperature is increased to 1350° C., an increase of the buried oxide layer thickness is about 30 nm. A conventional buried oxide layer produced by a SIMOX method is 80–90 nm, whereas, in the present invention the buried oxide layer thickness reaches 100–110 nm when the oxidation treatment will be practiced at 1350° C. and the thickness of the surface oxide layer is 400 nm.

It is therefore necessary to keep the oxidation processing temperature equal to at least 1150° C. to attain a satisfactional increase of thickness. Also, the maximum temperature should be lower than the melting temperature of the silicon which is 1415° C.

Figure 5:
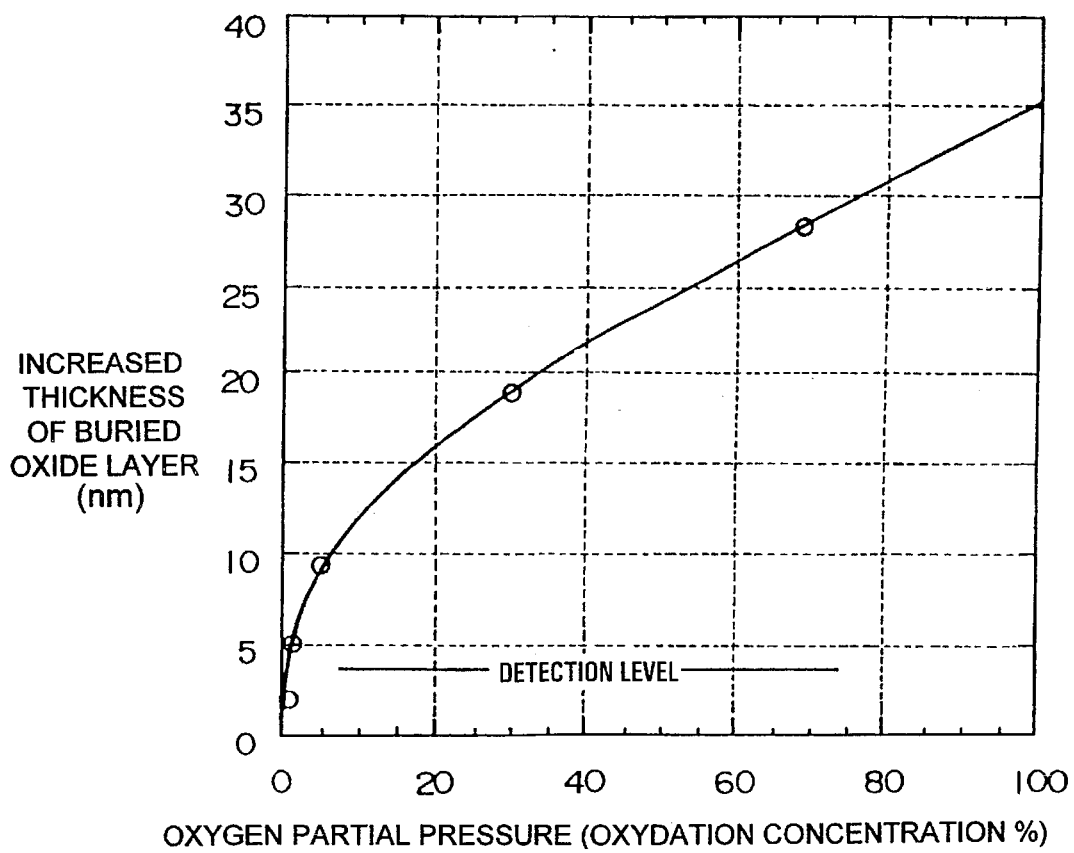
FIG. 5 is a graph showing a relationship between an increased thickness of a buried oxide layer and an oxygen partial pressure during an oxidation process.

It is generally believed that the oxygen concentration in the oxygen atmosphere also contributes to increasing the thickness of the buried layer. In fact, when oxidation is performed at 1350° C. for four hours after the annealing process and the increase of the thickness of the buried oxide layer is measured corresponding to a change of the oxygen partial pressure, a graph as shown in FIG. 5 is developed. As can be seen from FIG. 5, an increased thickness of the oxide layer can be expected when the concentration of $O_2$ is greater than 1%. At 0.5%, the increased thickness is too slight to detect because of the roughness of the buried oxide layer interface. Thus, the effect of increasing the thickness of the buried oxide layer can be obtained with certain limitations when the oxygen concentration is over 1%. This is due to the fact that the oxygen in the atmosphere is diffused from at least the surface silicon layer and the substrate silicon layer into the inside, so that the additional formation of $SiO_2$ at the interface portion of the buried oxide layer can be generally regulated upon a temperature condition. It is therefore believed that the minimum concentration for diffusing to the silicon layer should be over 1% as mentioned above. But, as can be understood from FIG. 5, the increase of the oxygen concentration at certain high temperatures can cause the increase of the thickness.

If the thickness of the surface silicon layer is required to be thinned depending upon a final device condition, a sacrifice oxidation treatment will be practiced. The sacrifice oxidation treatment is used to form an oxide layer at a surface by heat oxidation and to remove the oxide layer from the surface by means of a generally known method to thin the surface silicon layer by a thickness of the oxidized silicon. In order to avert an influence to the buried oxide layer thickness due to the sacrifice oxidation, the oxidation temperature should be set at a temperature lower than the anneal temperature. Particularly the oxidation temperature should equal-to or less than 1100° C. However, the sacrifice oxidation may be practiced before or after the thickness increase process for the buried oxide layer.

In view of the foregoing, the method of producing an SOI substrate according to the present invention comprises the steps of: (i) implanting the oxygen ions into a single crystal silicon substrate; (ii) forming a buried oxide layer by an annealing process in which a high temperature process is practiced in an inert gas atmosphere; (iii) forming on the buried oxide layer a surface single-crystal silicon layer which is electrically insulated from the substrate by continuing the annealing process until the thickness of the buried oxide layer reaches a certain value based on the dose of the implanted oxygen ions; and (iv) oxidizing the substrate in the high temperature oxidation atmosphere.

The temperature of the high temperature oxidation process after the annealing process should be equal to or greater than 1150° C. and less than a melting temperature of the single crystal silicon substrate. Additionally, the high temperature oxidation process which occurs after the annealing process should be practiced in an oxygen gas atmosphere with a concentration higher than that used in the annealing process.

After the oxidation process in the high temperature oxygen gas atmosphere, an oxide layer which forms on a surface of the substrate can be removed by practicing a sacrifice oxidation at a temperature equal to or less than 1100° C., and thinning the surface silicon layer by removing the sacrifice oxidation layer. The sacrifice oxidation is desirable to thin only the surface silicon layer. However, when oxidizing the SOI substrate at a temperature over 1150° C., the thickness of the buried oxide layer is naturally increased. Thus, when performing the sacrifice oxidation, the temperature is required to be set below the temperature used when oxidizing the SOI substrate. Accordingly, in the sacrifice oxidation, by using a temperature with an upper limit of 1100° C., the buried oxide layer thickness will not be influenced.

Figure 6:
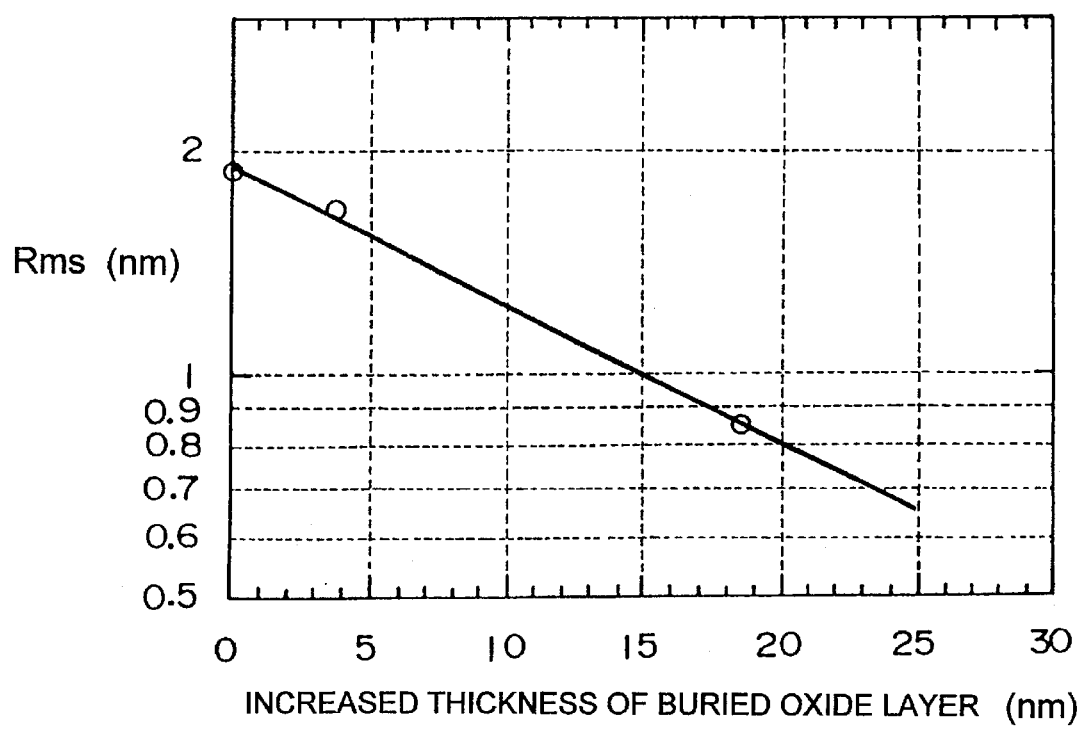
FIG. 6 is a graph showing a relationship between a square root mean roughness (Rms) and an increased thickness of a buried oxide layer.

After practicing the annealing process until the thickness of the buried oxide layer reaches a certain value theoretically calculated from the dose of the implanted oxygen, a property chart showing the relationship between the increase of the buried oxide layer thickness and the oxidation temperature will be obtained. By increasing the thickness of the buried oxide layer by oxidizing the substrate in a high temperature atmosphere at a temperature condition based on a preliminarily prepared property chart showing the relation between the increase of the buried oxide layer and the oxidation temperature in conformity with the increased thickness to close pinholes in the buried oxide layer, the restoration of defect in the buried insulation layer into which the ions were not implanted because of adhered particles can be attained and the beakdown electric strength of the insulation layer can be improved. The diameter and numbers of pinholes change based on the implantation condition of the oxygen ions. It is hard to directly understand and identify each pinhole. Thus, the pinhole condition of a substrate should be obtained by a statistical method based on the ion implantation condition. Also, the increased thickness of the buried oxide layer should be controlled to decrease a diameter of the main group pinholes. For example, when the diameter of a pinhole is considered to be 50 nm, the thickness of the buried oxide layer should be increased by one half of this value which is 25 nm When increasing the thickness of the buried oxide layer by oxidizing the substrate in a high temperature atmosphere, the buried oxide layer interface can be flattened. Specifically, when increasing the thickness of the buried oxide layer, a rough interface condition can be developed which reduces a deviation of the electrical characteristics of devices. Referring to FIG. 6, a square root mean roughness (Rms) of the buried oxide layer interface corresponds to an increase of the buried oxide layer. Thus, the high temperature oxidation condition should be determined with reference to FIG. 6 to achieve the necessary increase for flattening the interface.

Furthermore, when the substrate implanted by the oxygen ions is set in a furnace and heated under a low oxygen concentration condition for preventing a generation of surface pits, the annealing process will be carried out such that the thickness of the buried oxide layer becomes the theoretical value calculated from the dose of the implanted oxygen. In the high temperature and high oxygen concentration atmosphere, after a certain increase of oxygen concentration, the thickness of the buried oxide layer can be increased by oxidizing the substrate having the buried oxide layer. The silicon substrate implanted by the oxygen ions under the low oxygen concentration is annealed at a temperature which is maintained at a range of 800°–850° C. Then, after an inert gas is filled up not to generate crystal defects, the substrate is timber heated until about 1100°–1300° C. to obtain a stable state of its crystal.

During the annealing process, the gas atmosphere is controlled to include oxygen at a concentration level of 0.5% to prevent a generation of pits on the surface. When the temperature increase for the anneal processing in the low concentration oxygen atmosphere is finished, the gas atmosphere temperature equals or exceeds the annealing temperature. It is therefore necessary to regulate the oxygen concentration to maintain the oxygen partial pressure of, for example, 70% in the gas atmosphere, such that the high temperature oxidation is carried out at a constant temperature. The interface of the buried oxide layer in the substrate grows such that the thickness of the buried oxide layer formed becomes thicker than the thickness of the buried oxide layer formed by the conventional SIMOX process.

An SOI substrate produced by the above-mentioned method has a buried oxide layer with a thickness which exceeds 90 nm, a dislocation density of the surface silicon single crystal layer which is equal to or less than 100 cm$^2$, a pinhole density of the buried oxide layer which is equal to or less than 20 cm$^2$, and a square root mean roughness of the buried oxide layer interface which is equal to or less than 1 nm. Accordingly, the present invention provides a qualified SOI substrate in which the buried oxide layer is thickened, there are few pinholes in the buried oxide layer, and the flatness of the buried oxide layer interface is improved as compared with substrates produced by the conventional SIMOX method.

In accordance with the present invention, a substrate produced by a conventional SIMOX method which is annealed after the oxygen ions are implanted is further oxidized in a high temperature atmosphere at a temperature equal to or greater than 1150° C. but less than a melting temperature of the silicon, such that a thickness of the buried oxide layer is increased. The increased thickness of the layer can be attained by setting the oxygen concentration in excess of 1% when oxidizing at a high temperature. When particles are adhered on the surface silicon single crystal layer when the oxygen ions are implanted and pinholes are generated in the buried oxide layer, or when the flatness of the buried oxide layer interface is unacceptable, the additional oxide layer generated through the high temperature oxidation treatment can repair the pinholes or improve the flatness. Also, if a sacrifice oxidation processing is carried out before or after the high temperature oxidation treatment, the surface silicon single crystal layer can be thinned to the expected level.

The high temperature oxidation treatment can be separately conducted from the annealing process in which the buried oxide layer is formed, however, the oxidation process must be follow the annealing process at the higher temperature to increase the thickness of the buried oxide layer. In other words, the annealing process will be practiced in the gas atmosphere containing an oxygen level of low concentration while the temperature increases, and the oxidation treatment is practiced after the oxygen concentration is increased to successively produce a desired buried oxide layer.

The preferred embodiment of the present invention will now be described with reference to the drawings.

FIG. 1 is an explanatory view showing successive processes for producing an SOI substrate in accordance with the present invention, where the SOI substrate is depicted in various sections. The first process is an oxygen-ion implantation process in which oxygen ions $^{16}O^+$ are implanted at a predetermined portion in depth in a single crystal silicon substrate 1 by means of an ion implanter. The dose of the implanted oxygen ions should be within $0.5\times10^{18}/cm^2$ to prevent a dislocation density of the surface silicon single crystal layer 2 from increasing and a strength of an electric field formed across the buried oxide layer from decreasing. The reference numeral 3 in the drawings designates a layer of highly concentrated oxygen atoms which were formed as a result of the implantation process.

The second process is a forming process in which an annealed top coat 4 of $SiO_2$ is formed on surface of the single crystal silicon substrate 1 by a CVD apparatus. It should be understood that the annealed top coat is not always necessary before the third process described below.

The third process is an annealing process in which the substrate is processed under a furnace atmosphere containing therein Ar gas having 0.5% partial oxygen pressure, being maintained first at temperature of 850° C. and thereafter at a temperature of 1350° C. The above-explained annealing process is to stabilize the crystal state such that the layer of highly concentrated implantation of oxygen ions is transformed into a buried oxide layer 5. The reference numeral 6 should be understood to designate an oxide layer formed by the annealing process. As can be understood, the above-described processes are the same within the prior art.

The fourth process is an oxidization process performed at a high temperature where the single crystal silicon substrate 1 is heated at a temperature equal to or greater than 1150° C. but less than a melting temperature of the crystal silicon substrate for several hours. The $O_2$ gas concentration should be maintained in a range of over 1% and equal to or less than 100%. As shown in the drawings, it is acknowledged that three patterns result from such oxidation treatment. The drawing on the left side of FIG. 1 show a process to increase the buried oxide layer 5 formed through the anneal process by a thickness of additionally formed buried oxide layer 7. The reference numeral 8 designates an increased oxide layer after the high temperature oxidation process. The drawing shown in the middle portion of FIG. 1 explains how a pin hole 9, made in the buried oxide layer owing to the masking effect when the oxygen ions were implanted into the single crystal silicon substrate 1, will be eliminated. The drawing shown on the tight side of FIG. 1 explains an interface flattening process of the buried oxide layer, wherein a surface irregularity of the buried oxide layer 5 can be flattened or smoothed off by the additionally formed buried oxide layer 7. The improvement of flattening can be acknowledged from FIG. 6 which is a property chart based on a relationship between a square root mean roughness (Rms) and an increase in the buried oxide layer. Accordingly, when applying the process to electrical devices which required flattening, the amount the buried oxide layer needs to be increased can be determined with reference to FIG. 6 so that a preferable high temperature oxidation condition can be determined. It should be noted that the fourth process can be carried out after removing the oxide layer 6 formed during the third process.

The fifth process is a sacrifice oxidation process where an oxidation treatment is used to make the surface single crystal silicon layer 2 thinner. The sacrifice oxidation process may be carried out after removing the increased oxide layer 8. Otherwise, the sacrifice oxidation process may be performed between the annealing process and the high temperature oxidation process. Also, the sacrifice oxidation process can be conducted after removing the oxide layer 6.

The third process, which is the annealing process, can be carried out in conjunction with the high temperature oxidation process. Particularly, the substrate to be processed can be preliminarily set in the furnace in which the annealing gas is placed at a predetermined temperature to carry out the above-explained annealing process. When the furnace temperature exceeds 1200° C. (e.g. 1350° C.), the temperature is maintained. Then, additional oxygen is added into the furnace to achieve an oxygen partial pressure of 70% such that the high temperature oxidation process can be carried out.

Examples of conducting the annealing process independently and in conjunction with the high temperature oxidation process are shown in FIGS. 2(1) through 2(3). In FIG. 2(1), the initial furnace temperature is within a range of 800°–850° C., and the furnace is filled up with the annealing gas and its temperature is increased to thereby obtain the buried oxide layer 5. The high temperature oxidation process is then conducted independently after the annealing process. The high temperature oxidation process is carried out by increasing the oxygen partial pressure to a predetermined oxygen concentration of 70% in the furnace, increasing the temperature to 1350° C. and maintaining the temperature of 1350° C. FIG. 2(2) shows how the two independent processes shown in FIG. 2(1) can be carried out in conjunction with one another. Referring to FIG. 2(2), the high temperature anneal processing is carried out, then the oxygen partial pressure in the furnace is increased, and thereafter the high temperature oxidation process is practiced. FIG. 2(3) shows another example of performing the two process steps in conjunction with one another, where the annealing process is practiced while the furnace temperature is increased and the high temperature oxidation is thereafter carried out.

It is not necessary to for the annealing temperature to equal the oxidation temperature. For example, when the annealing temperature in 1350° C., the oxidation temperature may be set at 1300° C.

One experimental example under the present invention is described as follows. During the first step of the process, where oxygen ions are implanted, a dose of oxygen ions with a volume of $0.4\times10^{18}/cm^2$ and an acceleration energy of 180 keV are implanted into the single crystal silicon substrate to form the layer of the highly concentrated implantation of oxygen atoms at a predetermined depth.

Next, during the annealing process, the annealing temperature is defined at 1350° C. and the buried oxide layer is formed for 4 hours in the atmosphere gas having Ar with $O_2$ defined by the density of 0.5%. Third, during the high temperature oxidation process, the oxidation temperature is set at 1350° C. and an increase of the buried oxide layer thickness is admitted after four hours. The concentration of $O_2$ is enough to be within a range greater than 1% and less than 100%. In this example the concentration is controlled at a discharge ratio of 30% and 70% in the argon gas. It is important to note, however, that when the $O_2$ concentration is at 1%, it is too small to produce an increase the thickness of the buried oxide layer. Next, a sacrifice oxidation process is implemented to decrease the thickness of the surface silicon single crystal layer. The sacrifice oxidation process is practiced at 1100° C. Thereafter, the surface oxide layer is removed to obtain the substrate applied to devices.

Examinations regarding the buried oxide layer thickness, pinhole density and flatness of the buried oxide layer interface were conducted for the buried oxide layer of the SIMOX substrate which is processed under the above-mentioned high temperature oxidation process. The results of these examinations are described below.

First, the examinations revealed a coordinate relationship between the oxidation temperature and the increased thickness of the buried oxide layer, which is shown in FIGS. 3 and 4, where the thickness was measured by means of an ellipsometry spectroscope. In FIG. 3, the surface of the silicon single crystal layer is oxidized by about 180 nm, and in FIG. 4 the oxidation time is fixed at four hours and the concentration of $O_2$ is set at 70%. As can be known from these drawings, an increase ratio of the buried oxide layer thickness can be increased in response to an increase of the oxidation temperature. If the oxidation temperature is below 1100° C., the increase ratio of the buried oxide layer thickness is slight or if the oxidation time is four hours, the increase will be too small to be measured and to obtain a thickness increase effect. But, when the oxidation temperature is over 1350° C., the increased thickness of the buried oxide layer reaches about 30 nm. While, the thickness of the buried oxide layer is 80–90 nm according to the prior art, the thickness of the buried oxide layer according to the present invention becomes 100–110 nm when the oxidation process is practiced at 1350° C. and the thickness of the surface oxide layer is 400 nm.

Figure 7:
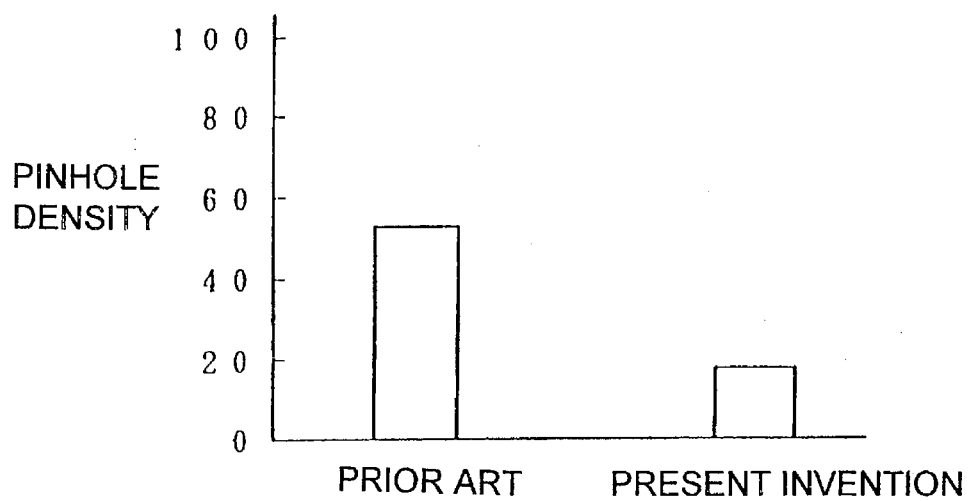
FIG. 7 is a chart comparing a pinhole density in a buried oxide layer of a prior art device with a pinhole density in a buried oxide layer of the present invention.

Second, the examinations revealed that the present invention results in a decrease in pinhole density. As shown in FIG. 7, prior art devices maintained a pin hole density of about 53 cm$^2$ However, in the present invention, the pin hole density was decreased to 18 cm$^2$ when the oxidation process is done with the 30% $O_2$ gas at 1350° C. for four hours. Furthermore, when the oxidation process was practiced at 1100° C., neither a thickness increase of the buried oxide layer nor a decrease of the pinhole density appeared.

Figure 8:
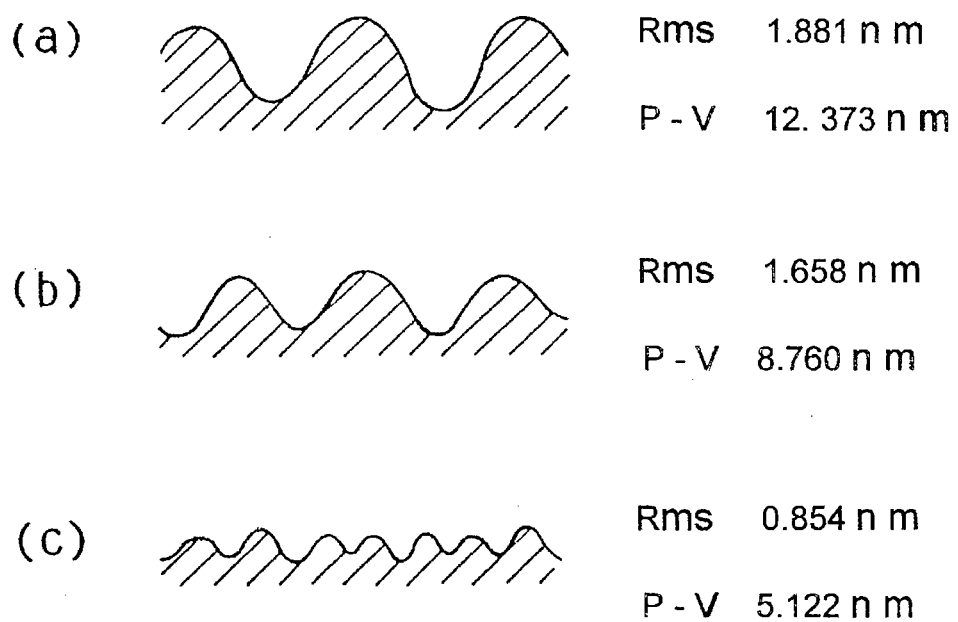
FIG. 8 is a schematic diagram of an interface between a surface single crystal silicon layer and a buried oxide layer after implanting the oxygen ions, where
Figure 9:
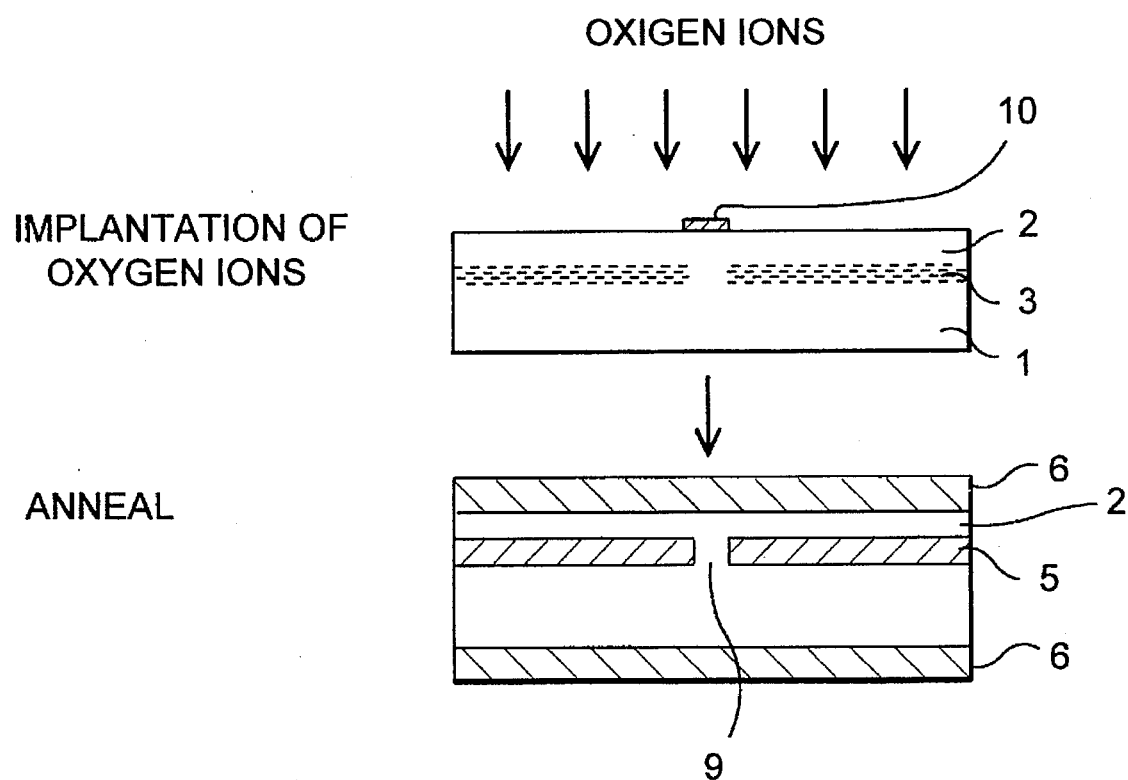
FIG. 9 is a diagram illustrating a masking effect of particles.
Figure 10:
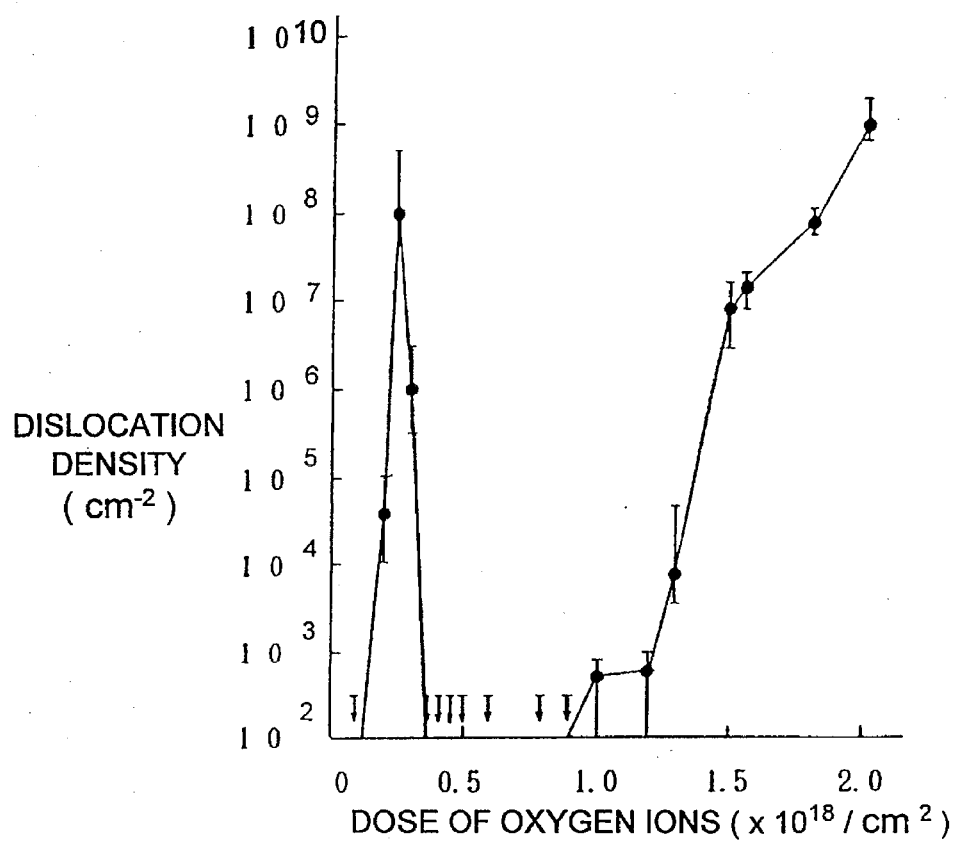
FIG. 10 is a graph showing a relationship between a dislocation density and a dose of oxygen ions.
Figure 11:
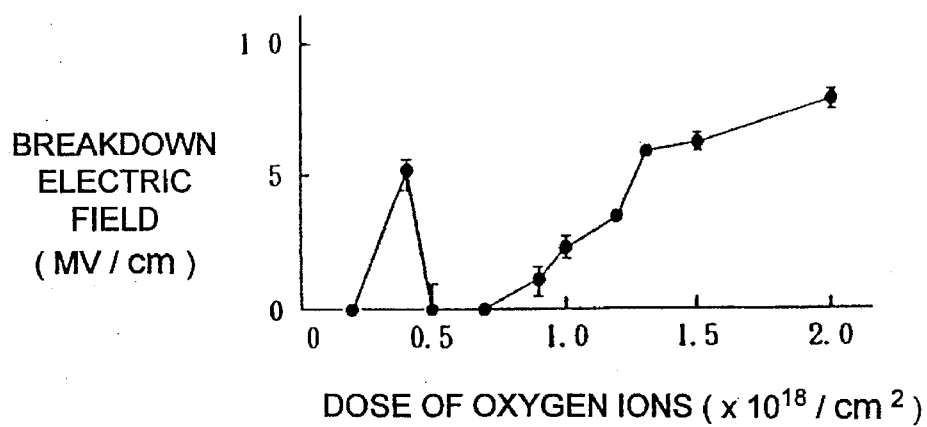
FIG. 11 is a graph showing a relationship between an electric insulation property of a buried oxide layer and a dose of oxygen ions.

Third, the examination of flatness regarding to the buried oxide layer interface is practiced by first removing the surface oxide layer of the SIMOX substrate by means of a delute fluorine, second removing the surface silicon single crystal layer by the potassium hydroxide solution, and then inspecting an irregularity of the buried oxide layer interface with an atomic force microscope. FIG. 8(a) is a partial sectional view of the buried oxide layer interface when observing the SIMOX substrate in the prior art where the example was annealed in an atmosphere of Ar+0.5% $O_2$ at 1350° C. for the anneal process for four hours after implanting the oxygen ions. A micro-roughness of the buried oxide layer interface (Rms) is 1.881 nm and a depth from the top to the bottom of the toughness (P-V) is 12.373 nm. FIG. 8(b) shows the inspection result of a processed SIMOX substrate which was obtained by implanting oxygen ions, conducting the annealing process in the atmosphere of Ar+0.5% $O_2$ for four hours at 1350° C., and carrying out the oxidation process at 1350° C. for four hours in the atmosphere of Ar+0.5% $O_2$. Since the concentrated oxygen at the oxygen processing is low, it causes the micro roughness (Rms) of the buried oxide layer interface to be 1.658 nm and the depth (P-V) from the top to the bottom of the roughness to be 8.760 nm, which does not show improvements. FIG. 8(c) shows the results of a substrate produced by the present invention, where oxygen ions are implanted, the annealing process is conducted in the atmosphere of Ar+0.5% $O_2$ for four hours at 1350° C., sad the oxidation process is farther carried out at 1350° C. for four hours with 30% $O_2$. As a result, the flatness of the buried oxide layer interface is improved to have a micro roughness (Rms) of 0.854 nm and to be the depth (P-V) from the top to the bottom of the roughness of 5.122 nm.

Lastly, the examination revealed improved results concerning the electric insulation property of the buried oxide layer. In particular, when the implanted oxygen ions were $0.4 \times 10^{18}/cm^2$, the pinhole density was decreased to one-third the pinhole density of a conventional device, the thickness of the buried oxide layer was increased, and the electric insulation property was improved from 40 V to 64 V.

What is claimed is:

1. A method of producing an SOI substrate, comprising the steps of:

implanting oxygen ions into a single crystal silicon substrate;

forming a buried oxide layer by an anneal process in which a high temperature process is practiced in an inert gas atmosphere;

forming on the buried oxide layer a surface single-crystal silicon layer electrically insulating from the substrate by continuing the annual process until the thickness of the buried oxide layer reaches a certain value theoretically calculated from the dose of an implanted oxygen; and oxidizing the substrate in the high temperature oxidation atmosphere wherein the temperature of said high temperature oxidation process after the anneal process is at least 1150° C. but less than the melting temperature of the single-crystal silicon substrate.

2. The method of producing the SOI substrate according to claim 1, wherein said high temperature oxidation process after the anneal process is practiced in an oxygen gas atmosphere of which concentration is higher than that in the anneal process.

3. The method of producing the SOI substrate according to claim 1, further comprising after said oxidation process in the high temperature oxidation atmosphere the steps of:

removing an oxide layer on surface of the substrate;

practicing sacrifice oxidation at on or less that 1100° C.; and thinning the surface silicon layer by removing the sacrifice oxidation layer.

4. The method of producing the SOI substrate according to claim 1, further comprising after the anneal process the steps of:

practicing sacrifice oxidation at on or less than 1100° C.;

thinning the surface silicon layer by removing the sacrifice oxidation layer; and oxidizing the substrate in the high temperature oxidation atmosphere.

5. The method of producing the SOI substrate according to claim 2, wherein said high temperature oxidation process after the anneal process is practiced in an oxygen gas atmosphere of which concentration is higher than 1%.

6. A method of producing a SOI substrate, comprising the steps of:

implanting oxygen ions into a single crystal silicon substrate;

forming a buried oxide layer by an anneal process in which a high temperature process is practiced in an inert gas atmosphere;

forming on the buried oxide layer a surface single-crystal silicon layer electrically insulating from the substrate by continuing the anneal process until the thickness of the buried oxide layer reaches a certain value theoretically calculated from the dose of an implanted oxygen; and increasing thickness of the buried oxide layer by oxidizing the substrate in a high temperature atmosphere at a temperature condition of at least 1150° C. based on a preliminarily prepared property chart showing a relationship between an increase of the buried oxide layer thickness and an oxidation temperature.

7. A method of producing a SOI substrate, comprising the steps of:

implanting oxygen ions into a single-crystal silicon substrate;

forming a buried oxide layer by an anneal process in which a high temperature process is practiced in an inert gas atmosphere;

forming on the buried oxide layer a surface single-crystal silicon layer electrically insulating from the substrate by continuing the anneal process until the thickness of the buried oxide layer reaches a certain value theoretically calculated from the dose of an implanted oxygen; and increasing thickness of the buried oxide layer by oxidizing the substrate in a high temperature atmosphere at a temperature condition of at least 1150° C. based on a preliminarily prepared property chart showing a relationship between an increase of buried oxide layer thickness and an oxidation temperature in conformity with the increased thickness to close pinholes in the buried oxide layer.

8. A method of producing an SOI substrate, comprising the steps of:

implanting oxygen ions into a single-crystal silicon substrate;

forming a buried oxide layer by an anneal process in which a high temperature process is practiced in an inert gas atmosphere;

forming on the buried oxide layer a surface single-crystal silicon layer electrically insulating from the substrate by continuing the anneal process until the thickness of the buried oxide layer reaches a certain value theoretically calculated from the dose of an implanted oxygen; and increasing thickness of the buried oxide layer by oxidizing the substrate in a high temperature atmosphere at a temperature condition of at least 1150° C. based on a preliminarily prepared property chart showing a relationship between an increase of buried oxide layer thickness and an oxidation temperature in conformity with the increased thickness to flatten an interface of the buried oxide layer.

9. A method of producing an SOI substrate, comprising the steps of:

implanting oxygen ions into a single crystal silicon substrate;

forming a buried oxide layer by an anneal process until the thickness of the buried oxide layer reaches a certain value theoretically calculated from the dose of an implanted oxygen in a state that a substrate implanted therein by the oxygen ions is heated in a furnace; and increasing the thickness of the buried oxide layer by oxidizing the substrate in a highly temperature and high concentrated oxygen atmosphere after the furnace temperature is increased over the anneal temperature.

\* \* \* \* \*

UNITED STATES PATENT AND TRADEMARK OFFICE
CERTIFICATE OF CORRECTION

PATENT NO. : 5,658,809
DATED : August 19, 1997
INVENTOR(S) : Sadao Nakashima, Katsutoshi Izumi, Norihiko Ohwada, Tatsuhiko Katayama It is certified that error appears in the above-identified patent and that said Letters Patent is hereby corrected as shown below:

Column 9, line 49, change "53 $cm^{2}$" to --53 $cm^{-2}$--;

line 50, change "18 $cm^{2}$" to --18 $cm^{-2}$--.

Signed and Sealed this

Second Day of March, 1999

Attest:

Q. TODD DICKINSON

*Attesting Officer*   *Acting Commissioner of Patents and Trademarks*